United States Patent
Darwish et al.

(10) Patent No.: US 10,316,403 B2
(45) Date of Patent: Jun. 11, 2019

(54) METHOD FOR OPEN-AIR PULSED LASER DEPOSITION

(71) Applicant: Dillard University, New Orleans, LA (US)

(72) Inventors: Abdalla Darwish, Kenner, LA (US); Sergey Sarkisov, Huntsville, AL (US)

(73) Assignee: Dillard University, New Orleans, LA (US)

( * ) Notice: Subject to any disclaimer, the term of this patent is extended or adjusted under 35 U.S.C. 154(b) by 0 days.

(21) Appl. No.: 15/435,778

(22) Filed: Feb. 17, 2017

(65) Prior Publication Data

US 2017/0233862 A1 Aug. 17, 2017

Related U.S. Application Data

(60) Provisional application No. 62/389,086, filed on Feb. 17, 2016.

(51) Int. Cl.
| | |
|---|---|
| *C23C 16/48* | (2006.01) |
| *C23C 14/28* | (2006.01) |
| *C23C 14/34* | (2006.01) |
| *C23C 14/22* | (2006.01) |
| *C23C 14/06* | (2006.01) |

(52) U.S. Cl.
CPC .............. *C23C 14/28* (2013.01); *C23C 14/06* (2013.01); *C23C 14/225* (2013.01); *C23C 14/3485* (2013.01); *C23C 16/483* (2013.01)

(58) Field of Classification Search
CPC .. C23C 14/3485; C23C 14/225; C23C 16/483
See application file for complete search history.

(56) References Cited

U.S. PATENT DOCUMENTS

| | | | |
|---|---|---|---|
| 5,192,580 A | 3/1993 | Blanchet-Fincher | 427/596 |
| 5,246,885 A | 9/1993 | Braren | 257/E21.546 |
| 5,304,406 A | 4/1994 | Hongo | 427/554 |
| 5,490,912 A | 1/1996 | Warner et al. | 204/298.02 |
| 5,535,128 A | 7/1996 | Laube et al. | 564/468.12 |

(Continued)

FOREIGN PATENT DOCUMENTS

| | | |
|---|---|---|
| JP | 2006117986 A | 5/2006 |
| KR | 100745619 B1 | 7/2007 |

(Continued)

OTHER PUBLICATIONS

Konov, V.I., et al., "Pulsed laser deposition of hard coatings in atmospheric air". Applied Physics A 79, 931-936 (2004).*

(Continued)

*Primary Examiner* — Bret P Chen
(74) *Attorney, Agent, or Firm* — James Richards

(57) ABSTRACT

A method for open-air pulsed laser deposition by providing a target and a substrate, configuring a laser directed to the target, reducing the pressure in the zone between the target and substrate by providing a suction having an opening proximal to the target. Optionally, shielding the zone between the target and substrate from ambient oxygen by flowing an inert gas from outside the zone. The method may accommodate very large substrates and multiple targets and multiple laser beams. The target may be tilted or remotely tilted. Matrix assisted pulsed laser deposition may be utilized.

10 Claims, 1 Drawing Sheet

(56) References Cited

U.S. PATENT DOCUMENTS

| | | | |
|---|---|---|---|
| 5,558,788 A | 9/1996 | Mashburn | 219/121.68 |
| 5,612,887 A | 3/1997 | Laube et al. | 364/468.12 |
| 5,660,746 A | 8/1997 | Witanachchi et al. | 219/121.66 |
| 5,711,810 A | 1/1998 | Sengupta | 118/722 |
| 5,747,120 A | 5/1998 | McLean, II et al. | 427/596 |
| 5,760,366 A | 6/1998 | Haruta | 219/121.68 |
| 5,820,682 A | 10/1998 | Sung | 118/726 |
| 5,849,371 A | 12/1998 | Beesley | 427/566 |
| 6,025,036 A | 2/2000 | McGill et al. | 427/492 |
| 6,037,313 A | 3/2000 | Nagaishi et al. | 505/474 |
| 6,103,442 A * | 8/2000 | Katagiri | G03G 5/08214 408/61 |
| 6,370,165 B1 | 4/2002 | Badzian et al. | 372/7 |
| 6,388,185 B1 | 5/2002 | Flurial | 136/203 |
| 6,491,795 B2 | 12/2002 | Christen et al. | 118/722 |
| 6,509,070 B1 | 1/2003 | Voevodin et al. | 427/572 |
| 6,632,539 B1 | 10/2003 | Iijima | 427/62 |
| 6,998,156 B2 | 2/2006 | Bubb et al. | 427/596 |
| 7,501,145 B2 | 3/2009 | Selvamanickam | 427/62 |
| 7,544,398 B1 | 6/2009 | Chang et al. | 427/537 |
| 7,660,042 B2 | 2/2010 | Sasaki et al. | 359/626 |
| 7,661,387 B2 | 2/2010 | Poullos | 118/667 |
| 7,977,602 B2 | 7/2011 | Birrell | 219/121.69 |
| 2002/0081397 A1 | 6/2002 | McGill | 427/596 |
| 2003/0121887 A1 | 7/2003 | Garvey | 216/65 |
| 2004/0031515 A1 | 2/2004 | Sadatomi | 136/209 |
| 2004/0040506 A1 | 3/2004 | Ovshinsky et al. | 118/718 |
| 2004/0140296 A1 | 7/2004 | Lis | 219/121.6 |
| 2004/0214362 A1 | 10/2004 | Hill | 438/33 |
| 2004/0250769 A1 * | 12/2004 | Freeman | C23C 14/048 118/718 |
| 2005/0181116 A1 | 8/2005 | Worsham | 427/2.1 |
| 2006/0051522 A1 | 3/2006 | Talton | 427/596 |
| 2007/0228298 A1 * | 10/2007 | Komori | H05G 2/003 250/493.1 |
| 2007/0243328 A1 | 10/2007 | Liu | 427/255.33 |
| 2008/0254235 A1 | 10/2008 | Kim | 427/596 |
| 2009/0042314 A1 | 2/2009 | Capobianco | 436/501 |
| 2009/0311513 A1 | 12/2009 | Hu et al. | 428/323 |
| 2010/0227133 A1 * | 9/2010 | Liu | C23C 14/3435 428/209 |
| 2011/0111131 A1 | 5/2011 | Vergohl et al. | 427/523 |
| 2011/0151270 A1 | 6/2011 | Rockstroh et al. | 428/550 |
| 2011/0194106 A1 * | 8/2011 | Murakami | B82Y 30/00 356/301 |
| 2011/0247669 A1 | 10/2011 | Gerrard | 136/205 |
| 2012/0055554 A1 * | 3/2012 | Radu | B82Y 30/00 136/264 |
| 2013/0022811 A1 | 1/2013 | Ahn | 428/336 |
| 2014/0068932 A1 * | 3/2014 | Sturcken | H05K 1/115 29/832 |
| 2014/0227461 A1 * | 8/2014 | Darwish | C23C 14/06 427/596 |
| 2015/0187814 A1 * | 7/2015 | Miyairi | H01L 27/1225 257/43 |

FOREIGN PATENT DOCUMENTS

| | | |
|---|---|---|
| WO | WO2010112956 A1 | 4/2009 |
| WO | WO2010017555 A1 | 8/2009 |
| WO | WO2013119298 A2 | 11/2012 |
| WO | WO2013155181 A1 | 4/2013 |

OTHER PUBLICATIONS

Chen, Zhaoyang, et al., "Effect of ambient pressure on laser ablation and plume expansion dynamics: A numerical simulation". Journal of Applied Physics 99, 063304 (2006), pp. 1-9.*

Wang, Bin, et al., "Influence of ambient air pressure on the energy conversion of laser-breakdown induced blast waves". J. Phys. D: Appl. Phys. 46 (2013) 375201, pp. 1-7.*

Nedyalkov, N., et al., "Nanostructured Au film produced by pulsed laser deposition in air at atmospheric pressure". Optics & Laser Technology 64 (2014) 41-45.*

Schlenkrich, Felix et al; "Pulsed laser deposition of polymer-metal nanocomposites" Applied Surface Science 257(2011) 5362-5365 Oct. 23, 2010.

Roder,Johanna et al; "Growth of polyer-metal nanocomposites by pulsed laser deposition"; Applied Physics A (2008) 93:863-867; Jun. 20, 2008.

Konov et al. (V.I. Konov, T.V. Kononeko, E.N. Loubnin, F. Dausinger, and D. Breitling, "Pulsed laser deposition of hard coatings in atmospheric air", Appl. Phys. A 79, 931-936 (2004)).

Wang et al. (H.-P. Wang and J. Lin, "The formation of diamond-like carbon film at atmospheric pressure by the pulsed laser/plasma hybrid deposition method", Surface & Coating Technology 204, 2246-2250 (2010)).

Nedyalkov et al. (N. Nedyalkov, A. Nikolov, P. Atanasov, M. Alexandrov, M. Terakawa, and H. Shimitzu, "Nanostructured Au film produced by pulsed laser deposition in air at atmospheric pressure", Optics & Laser technology 64, 41-45 (2014)).

AL Mercado, C.E. Allmond, J.G. Hoekstra, J.M. Fitz-Gerald, "Pulsed laser deposition vs. matrix assisted pulsed laser evaporation for growth of biodegradable polymer thin films", Applied Physics A, 81, 591-599(2005) Springer-Verlag Sep. 30, 2004.

G.B. Blancet and C.R. Fincher, Jr., laser induced unzipping: A thermal route to polymer ablation, Appl. Phys. Lett. vol. 65, No. 10, 1994, 1311-1313.

N. Morita, Y. Shimotsuma, M. Nishi, M. Sakakura, K. Miura, and K. Hirao, Direct micro-carbonization inside polymer using focused femtosecond laser pulses, Appl. Phys. Lett. vol. 105, 2014, 201104, 4 pages.

M. Molenda, M. Swietoslawski, M. Drozdek, B. Dudek, and R. Dziembaj, Morphology and electric conductivity of carbon nanocoatings prepared from pyrolized polymers, J. of Nanomaterials vol. 2014, Article ID 103418, 7 pages.

Andor; "Pulsed Laser Deposition"; Web Document downloaded Oct. 7, 2014.

Christen, Hans, "Pulsed Laser Deposition of YBa2Cu3O7-d for Coated Conductor Applications: Current Status and Cost Issues"; Oak Ridge National Laboratory, Web Document downloaded Oct. 7, 2014.

Namigashira, JP 2006117986 A, Machine Translation, originally published 2006, p. 1-35.

Ha, KR 100745619 B1, Machine Translation, originally published 2007, p. 1-8.

Subramanian, R., "Strength of Materials", 2010, Oxford University Press, 2nd Ed., p. 106.

\* cited by examiner

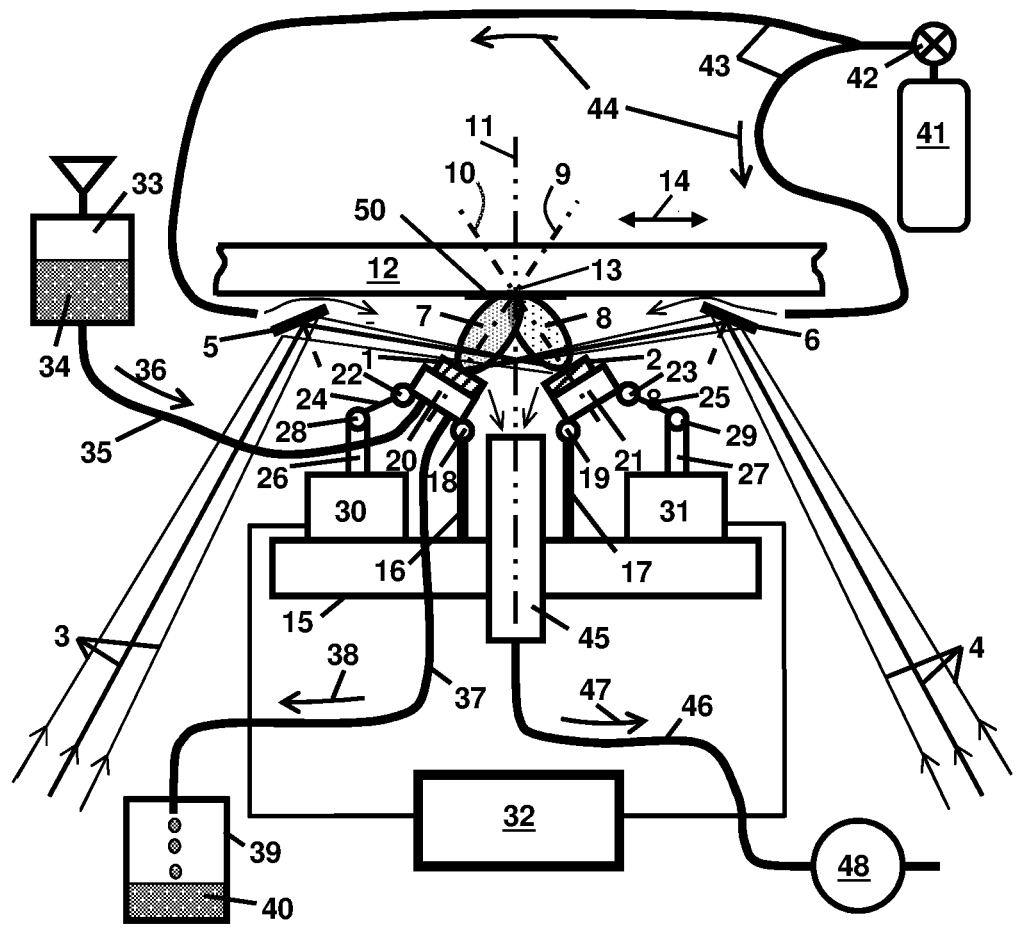

METHOD FOR OPEN-AIR PULSED LASER DEPOSITION

RELATED APPLICATIONS

This application claims the benefit under 35 USC 119(e) of provisional application Ser. No. 62/389,086 Titled "Method and apparatus for open-air multi-beam multi-target pulsed laser deposition," filed Feb. 17, 2016 by Darwish et al.

This application may have related disclosure to that found in application Ser. No. 14/158,567, titled "Multiple Beam Pulsed Laser Deposition Of Composite Films" filed 17 Jan. 2014 by Darwish et al, published 14 Aug. 2014, US2014/0227461A1; and application Ser. No. 14/506,685, titled "Multiple Beam Pulsed Laser Deposition Of Composite Films" filed 5 Oct. 2014 by Darwish et al., publication US 2016/0230265 A1, Aug. 11, 2016.

All of the above listed US Patent and Patent Application and Publication documents are hereby incorporated herein by reference in their entirety.

BACKGROUND

Technical Field

The present invention pertains generally to the field of deposition of thin films, more particularly, to deposition of films without the use of a vacuum chamber.

Background

Pulsed laser deposition (PLD) of thin films has a number of advantages over other methods such as the accurate control of film thickness, uniform coating, good control of the film composition, and the capability of selective deposition in specified regions. The technologies of the PLD are normally applied in the vacuum to avoid the interferences and obstruction of the ambient gases on the particles ablated from the target. However, PLD in the vacuum is expensive and is limited to the substrates of small size that can fit in the vacuum chamber.

Implementing PLD in ambient air or at atmospheric pressure may include the following characteristics:
1) At atmospheric pressure the mean free path of the ions of the target material knocked out by a high-energy laser beam from a target does not exceed one or two millimeters. This is due to very many collisions of the plume plasma ions with the molecules of the gases in ambient air.
2) PLD in ambient air has and a risk of chemical reaction of the plume ions with atmospheric oxygen leading to oxidation and other highly undesirable chemical transformations of the target material being deposited on the substrate.

BRIEF DESCRIPTION

Briefly, the present disclosure pertains to a method and apparatus for open-air (without a vacuum chamber) single or multi-beam single or multi-target pulsed laser deposition with a low pressure zone maintained between the targets and the substrate by pumping the ambient gas out with a vacuum pump. The zone between the targets and the substrate may be shielded from ambient oxygen with an inert gas flowing from outside. The films may be deposited on a large substrate, which may be freely translated with respect to the targets. The apparatus may accommodate multiple pulsed laser beams and multiple targets. The targets may be remotely tilted in order to provide optimal plume overlapping on the substrate. The target particulate may be blown away from the zone between the targets and the substrate by the flow of the inert gas, such as nitrogen or argon. The plumes may be isolated from ambient oxygen with a shield of the continuously flowing inert gas. This makes possible to deposit materials that are reactive with respect to oxygen. At least one target can be deposited using the matrix assisted pulsed laser evaporation process. The target can be made of a polymer solution frozen with circulating liquid nitrogen.

These and further benefits and features of the present invention are herein described in detail with reference to exemplary embodiments in accordance with the invention.

BRIEF DESCRIPTION OF THE FIGURES

The present invention is described with reference to the accompanying drawings. In the drawings, like reference numbers indicate identical or functionally similar elements. Additionally, the left-most digit(s) of a reference number identifies the drawing in which the reference number first appears.

FIG. 1 is a schematic diagram of an exemplary apparatus in accordance with the present disclosure.

DETAILED DESCRIPTION

The present disclosure pertains to open air laser deposition of thin films that may eliminate the need for operation in a vacuum chamber, potentially reducing the cost of industrial applications and allowing film depositions on large irregular objects as well as making more practical the possibility of field applications.

A. Aspects of the Invention

Aspects of the invention relate to addressing multiple performance characteristics, namely:
1) To increase the distance between the target and the substrate and provide more room for the adjustment of laser beam direction and the target orientation. As a result—to make possible to accommodate multiple targets and multiple laser beams with the plume direction adjustment for multi-beam multi-target PLD of composite films.
2) To isolate the ions of the target plume from atmospheric oxygen. So PLD in open air will not be limited to the materials (mainly, gold and diamond) that do not react with oxygen.
3) To implement open-air pulsed laser assisted deposition of organic materials, such as matrix assisted pulsed laser evaporation (MAPLE) or resonance infrared (RIR) MAPLE, not yet achieved.
4) To provide the removal of the target particulate knocked out by the laser beam from the space between the target and the substrate without the increase of the operating pressure above ambient atmospheric pressure.

B. Identification of Component Parts of the System

FIG. 1 is a schematic diagram of an exemplary apparatus in accordance with the present disclosure. The apparatus may comprise multiple targets and associated laser beams. For the sake of simplicity, the exemplary case of only two targets and laser beams is presented in FIG. 1. Referring to FIG. 1, targets 1 and 2 are ablated by focused pulsed laser beams 3 and 4 respectively. The beams 3 and 4 are directed to the targets with reflectors 5 and 6 respectively. The beams generate plasma plumes 7 and 8 from targets 1 and 2 respectively. The plumes 7 and 8 have their axes (plume directions) 9 and 10 respectively. The axes 9 and 10 are always perpendicular to the surfaces of the respective targets 1 and 2 due to the nature of the PLD process. The plumes propagate towards the surface of substrate 12. The directions of the plumes are adjusted to have the plumes overlapping in point 13 on the surface of the substrate. Line 11 is the normal to the surface of the substrate passing through the point 13. Line 11 is also a bisector of the angle between the plume directions 9 and 10. The substrate can be translated along in horizontal plane along directions 14. Base 15 holds the supports 16 and 17 of the targets 1 and 2 respectively. Hinges 18 and 19 are respectively attached on the top of the supports 16 and 17 respectively. The hinges 18 and 19 support holders 20 and 21 of the first and the second target respectively. Hinges 22 and 23 are attached to the target holders 20 and 21 respectively. The hinges 22 and 23 are connected to links 24 and 25 respectively. The links 24 and 25 are connected to hinges 28 and 29 respectively. The hinges 28 and 29 are attached to the free ends of shafts 26 and 27 of linear actuators 30 and 31 of the first and the second target respectively. The linear actuators are connected to controller 32.

One or both targets can be made of frozen polymer solution for MAPLE deposition. For the sake of simplicity FIG. 1 presents the case when only target 1 is made of polymer solution cooled with circulating liquid nitrogen (LN). Supply container 33 is filled with liquid nitrogen 34. Container 33 is connected with flexible feeding line 35 to target holder 20. LN is forced by the gravity to flow along direction 36. Target holder 20 has an inner cavity filled up with LN. LN exits the target holder 20 through collector line 37 and flows along direction 38. LN enters collector 39 with residual used liquid nitrogen 40.

The space between the targets 1 and 2 and substrate 12 is filled with inert gas to isolate the plumes from atmospheric oxygen. The inert gas is supplied from tank 41 with valve 42. The gas flows through two feeding lines 43 along directions 44. The inert gas enters the space between the targets and the substrate. The gas enters vacuum line inlet 45 and flows through vacuum line 46 along direction 47. The inert gas is pumped out by vacuum pump 48.

Referring to FIG. 1, note that the space occupied by the apparatus during operation is open to ambient atmosphere, typically air, comprising oxygen and nitrogen, and at ambient atmospheric pressure, typically at or near sea level (760 mm Hg pressure), typically at less than 3000 m pressure altitude. There is no vacuum chamber enclosing the apparatus including the target and substrate and capable of being pumped down to a small fraction of an atmosphere (less than 1/10 atmosphere, typically less than 100 mTorr, as would be typical in conventional systems.) Note that the vacuum source tube 45 has a diameter and the target is within one or two diameters of the vacuum source tube.

C. Method

An exemplary method may comprise one or more of the following steps:
1) Target 1 is pre-cooled and preserved in solid state by circulating LN.
2) Target 2 is mounted on its holder 21.
3) Air is pumped out from the space between targets 1 and 2 and substrate 12 with vacuum pump 48.
4) The space between the targets and the substrate is filled with flowing inert gas.
5) The targets are exposed to the corresponding laser beams.
6) Target holders 20 and 21 are tilted with linear actuators 30 and 31 respectively in order to obtain a desirable overlapping of plumes 7 and 8 in point 13 on the substrate.
7) The MAPLE/PLD process is conducted until a composite film 50 of a desirable thickness is obtained on substrates 12.
8) The laser beams can be attenuated to achieve different proportions of the components in the composite film.
9) Substrate 12 can be translated along horizontal directions 14 in order to achieve a uniform coating on large area.

D. Alternative Variations

In one alternate variation target 1 can be made of polymer, such as poly(methyl methacrylate) known as PMMA, dissolved in chloroform at a concentration of 1 g of solids per 10 mL of liquids frozen to solid state with LN. The target is exposed to a pulsed laser beam to implement the matrix assisted pulsed laser evaporation (MAPLE) process in which the frozen solvent dissipates the energy of the laser beam into heat transferred to the polymer that evaporates without dissociation and condenses on substrate 12 together with the material from the second target to form a polymer nanocomposite film 50. Target 2 can be made of metal, such as gold. Laser beams 1 and 2 can be of the same wavelength, such as 1064 nm (the fundamental harmonic of an Nd:YAG laser) or can have different wavelengths: 255 nm (the 4-th, UV harmonic of the Nd:YAG laser) for the polymer target 1 and 532 (the 2-nd, visible harmonic of the Nd:YAG laser) for metal target 2.

In yet another alternate variation, the number of targets and laser beams of different wavelengths are more than two to implement PLD of multi-composite films. One feature of the tilt control sub-system is that the target holders are tilted around the axes in the horizontal plane instead of vertical plane, which prevents from dropping or spilling the target material.

In yet another alternate variation MAPLE target 1 is a copper container (cup) for a polymer solution that can be frozen with circulating LN. The cup is mounted on target holder 20, which is a copper container for LN (the cooler) that will be cooling the polymer solution (the target) and keeping it frozen. The MAPLE target assembly is connected to the LN supply (feeding) and collector lines (flexible copper tubing). Feeding line 35 is connected to the LN supply vessel 33. The collector LN line 37 is connected to collector 40. One important feature of the target assembly is that target holder 20 is tilted around the axes in the horizontal plane instead of vertical plane. This makes possible to fill the cup with the polymer solution when it is still in liquid form without the risk of spilling it out.

In yet another alternative variation the inert gas is nitrogen.

In yet another alternative variation the inert gas is argon.

Exemplary Features of the Innovation and the Results or Benefits of its Application

A. Exemplary Features

The apparatus and the method may have the following features:
1) Increased (>2 mm) distance between the target and the substrate due to near vacuum ambient atmosphere pressure created by continuous pumping of the gas from the region with a vacuum pump.

2) The target plume is isolated from atmospheric oxygen by an inert gas.
3) The open-air pulsed laser assisted deposition of organic materials, such as matrix assisted pulsed laser evaporation (MAPLE) or resonance infrared (RIR) MAPLE, can be implemented.
4) The flowing inert gas blows away the target particulate knocked out by the laser beam.

B. Advantages

The advantages of the proposed apparatus and the method may include the following:
1) The increased distance between the target and the substrate and provides more room for the adjustment of laser beam direction and the target orientation. It becomes possible to accommodate multiple targets and multiple laser beams with the plume direction adjustment for multi-beam multi-target PLD/MAPLE of composite films.
2) The target plumes may be isolated from atmospheric oxygen by a shield of a flowing inert gas. Thus, PLD in open air may not be limited to the materials that do not react with oxygen.
3) The open-air pulsed laser assisted deposition of organic materials, such as matrix assisted pulsed laser evaporation (MAPLE) or resonance infrared (RIR) MAPLE, can been implemented.
4) The removal of the target particulate knocked out by the laser beam from the space between the target and the substrate without the increase of the atmospheric pressure can be implemented with the use of the flowing inert gas.

C. Basis of Operation

The method operates by creating a low pressure (near vacuum) zone in the space between the targets and the substrate and protecting this zone from ambient oxygen with a shield of inert gas flowing in the zone from outside. The former makes it possible to extend the size of the target plumes and correspondingly the distance between the targets and the substrate and accommodate multiple targets and multiple laser beams. The latter provides for the PLD/MAPLE of a variety of target materials regardless of their reactivity with regard to ambient oxygen.

Potential Commercial Applications

The apparatus and method may be used in commercial applications using composite coatings on substrates of large sizes, such as (a) corrosion resistant coatings; (b) wear resistant coatings; (c) hardening coatings; and (d) chemically inert coatings. The invention may be of great interest to the auto-motive and aero-space industries (corrosion and wear resistant coatings); food, bio-med, and petro-chemical industry (chemically inert coatings); and machine tool industry (wear resistant coatings).

CONCLUSION

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for pulsed laser deposition without a vacuum chamber, said method comprising:
providing a first target comprising material to be deposited;
providing a pulsed laser directed to said first target for ablating said material to be deposited;
positioning a substrate proximal to said first target and spaced from said first target, thereby forming a region between said substrate and said first target; said region open to ambient air, said ambient air having an ambient air pressure; said substrate configured for receiving ablated target material to form a film comprising said ablated target material on said substrate;
providing an inert gas source capable of displacing said ambient air in said region between said first target and said substrate;
providing a suction source configured to provide suction to reduce gas pressure in said region between said first target and said substrate, said suction source comprising a tube having an opening with a width dimension, said tube opening disposed within one said width dimension from said first target;
irradiating said first target with said pulsed laser, to create a first plume of said first material to be deposited;
receiving and condensing said first plume on said substrate to form a deposited film on said substrate;
concurrently with said irradiating said first target, flowing said inert gas from said inert gas source into said region between said first target and said substrate with sufficient flow to eliminate ambient oxygen from said region between said first target and said substrate;
concurrently with said irradiating said first target, lowering said gas pressure in said region between said first target and said substrate with said suction source, thereby reducing the pressure of said gas between said substrate and said first target.

2. The method as recited in claim 1, wherein the material to be deposited is reactive with respect to oxygen.

3. The method as recited in claim 1, wherein said first target is evaporated using a matrix assisted pulsed laser evaporation process.

4. The method as recited in claim 3, wherein said first target comprises a polymer solution frozen with circulating liquid nitrogen.

5. The method as recited in claim 3, wherein said first target comprises a solution of poly (methyl methacrylate) in chlorobenzene.

6. The method as recited in claim 1, further including a second target and associated second plume, further including a step comprising adjusting a target tilt to maintain overlapping of said first plume and said second plume on the substrate.

7. The method as recited in claim 1, further including: translating said substrate laterally with respect to said first target for improved deposition uniformity.

8. The method as recited in claim 1, wherein the flow of said inert gas is sufficient to clear target particulate from said region between said substrate and said first target.

9. The method as recited in claim 1, wherein said inert gas is nitrogen.

10. The method as recited in claim 1, wherein said inert gas is argon.

* * * * *